(12) United States Patent
Fuoco et al.

(10) Patent No.: US 11,823,759 B2
(45) Date of Patent: Nov. 21, 2023

(54) TESTING OF FAULT DETECTION CIRCUIT

(71) Applicant: TEXAS INSTRUMENTS INCORPORATED, Dallas, TX (US)

(72) Inventors: Charles Lance Fuoco, Allen, TX (US); Brian Karguth, Van Alstyne, TX (US); Jay Bryan Reimer, Houston, TX (US); Samuel Paul Visalli, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 107 days.

(21) Appl. No.: 17/402,706

(22) Filed: Aug. 16, 2021

(65) Prior Publication Data

US 2021/0375383 A1    Dec. 2, 2021

Related U.S. Application Data

(63) Continuation of application No. 16/601,303, filed on Oct. 14, 2019, now Pat. No. 11,094,392.

(60) Provisional application No. 62/745,887, filed on Oct. 15, 2018.

(51) Int. Cl.
*G11C 29/42* (2006.01)
*G06F 9/30* (2018.01)
*G06F 11/10* (2006.01)

(52) U.S. Cl.
CPC .......... *G11C 29/42* (2013.01); *G06F 9/30029* (2013.01); *G06F 11/1048* (2013.01)

(58) Field of Classification Search
None
See application file for complete search history.

(56) References Cited

U.S. PATENT DOCUMENTS 5,611,042 A * 3/1997 Lordi ................... G06F 11/1032
                                                              714/6.1
5,619,461 A    4/1997 Roohparvar
6,363,506 B1   3/2002 Karri et al.
(Continued)

OTHER PUBLICATIONS

Bowman, et al.; "All-Digital Circuit-Level Dynamic Variation Monitor for Silicon Debug and Adaptive Clock Control"; IEEE, vol. 58, Issue: 9, pp. 2017-2025; 2011.

*Primary Examiner* — Thien Nguyen
(74) *Attorney, Agent, or Firm* — Michael T. Gabrik; Frank D. Cimino

(57) ABSTRACT

A system-on-chip includes first and second devices. An interconnect segment couples between the first and second devices. A bridge is coupled between the first and second devices and coupled to the interconnect segment. At least one of the bridge or interconnect segment include first and second multiplexers, a monitor circuit, and exclusive-OR logic. The first multiplexer has first and second multiplexer inputs and a first multiplexer output. The second multiplexer has third and fourth multiplexer inputs and a second multiplexer output. The monitor circuit has a first and second monitor circuit outputs. The first monitor circuit output is coupled to the second multiplexer input and the second monitor circuit output is coupled to the fourth multiplexer input. The exclusive-OR logic has first and second exclusive-OR logic inputs. The first exclusive-OR logic input couples to the first multiplexer output and the second exclusive-OR logic input couples to the second multiplexer output.

20 Claims, 2 Drawing Sheets

(56) References Cited

U.S. PATENT DOCUMENTS

| | | | |
|---|---|---|---|
| 6,532,564 B1 * | 3/2003 | Ito | H04L 1/007 |
| | | | 714/752 |
| 6,813,734 B1 * | 11/2004 | Bhardwaj | H04J 3/062 |
| | | | 714/48 |
| 8,799,713 B2 | 8/2014 | Gangasani et al. | |
| 2004/0153925 A1 | 8/2004 | Ronza et al. | |
| 2013/0007513 A1 | 1/2013 | Traskov et al. | |

* cited by examiner

TESTING OF FAULT DETECTION CIRCUIT

CROSS-REFERENCE TO RELATED APPLICATIONS

This application is a continuation of U.S. patent application Ser. No. 16/601,303, filed Oct. 14, 2019, which claims priority to U.S. Provisional Patent Application No. 62/745,887, filed Oct. 15, 2018, each of which is incorporated by reference herein in its entirety.

BACKGROUND

Many types of electrical systems (e.g., systems-on-chip, "SoC") include memory, processors, peripheral devices, and other components that are interconnected by a series of interconnect segments and bridges. Data flows from a source device to a destination device through one or more of the interconnect segments and bridges. It is possible, however, that the data received by the destination device is not exactly the same as the data that was transmitted by the source device. For example, one or more bits of the data may "flip" (a "0" turning into a "1", or vice versa). Errors in the accuracy of the received data may be caused by defects in the circuitry, electromagnetic interference from external sources, etc. To ensure the accuracy of the data that is received at the destination device, many electrical systems employ a data error detection scheme such as through use of a parity bit or an error correction code (ECC).

SUMMARY

In one example, a system-on-chip includes first and second devices. An interconnect segment couples between the first and second devices. A bridge is coupled between the first and second devices and coupled to the interconnect segment. At least one of the bridge or interconnect segment include first and second multiplexers, a monitor circuit, and exclusive-OR logic. The first multiplexer has first and second multiplexer inputs and a first multiplexer output. The second multiplexer has third and fourth multiplexer inputs and a second multiplexer output. The monitor circuit has a first and second monitor circuit outputs. The first monitor circuit output is coupled to the second multiplexer input and the second monitor circuit output is coupled to the fourth multiplexer input. The exclusive-OR logic has first and second exclusive-OR logic inputs. The first exclusive-OR logic input couples to the first multiplexer output and the second exclusive-OR logic input couples to the second multiplexer output.

BRIEF DESCRIPTION OF THE DRAWINGS

For a detailed description of various examples, reference will now be made to the accompanying drawings in which.

DETAILED DESCRIPTION

For safety and reliability reasons, an electrical system may contain circuits which check for faults in data (e.g., parity or ECC). The fault detection circuits themselves may experience faults. To protect against faults in the operation of the fault detection circuits, the electrical system may periodically test the operation of each such fault detection circuit. In one scheme, a fault detection circuit is disabled from use by the electrical system. During the period of being disabled, the fault detection circuit is tested. Disabling the fault detection circuit in order to test it renders the electrical system susceptible to erroneous operation if errors occur in the data flowing through the system that otherwise would have been detected and possibly corrected by the fault detection circuit.

In another scheme, the entire electrical system can be temporarily taken "off-line" to allow for the fault detection circuit(s) to be tested. While pausing the operation of the entire system avoids erroneous operation due to data integrity errors, pausing the electrical system's operation may have undesirable rippling effects in a larger environment in which the electrical system resides. In one example, real-time critical operations may necessitate continual operation of the electrical system containing the fault detection circuit to be tested, and thus may not tolerate pausing the operation of the electrical system.

The examples described herein detect when a communication link within an electrical system is not being used during a given cycle, and then initiate a test of the communication link's fault detection circuit. This type of fault detection circuit test is suitable in electrical systems in which bus traffic tends to be "bursty," that is, large amounts of data are transmitted across a bus followed by one or more bus cycles of non-activity. The principles described herein can be applied to testing any type of device during run-time of a system that includes the device, but when the device to be tested is not actively being used. Examples of such devices include memory, flip-flops, logic gates, and other types of electrical devices and circuits.

Figure 1:
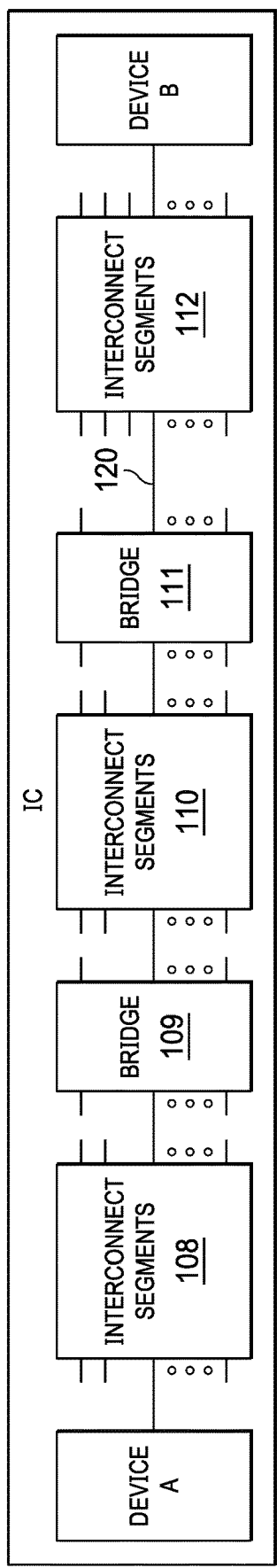
FIG. 1 illustrates an example of electrical system comprising error detection circuits that are tested during idle bus cycles.

FIG. 1 shows an example of an electrical system 100. The electrical system 100 in this example includes devices A and B, interconnect segments 108, 110, and 112, and bridges 109 and 111. In this example, the interconnect segments 108, 110, and 112, bridges 109 and 111, device A, and device B are provided on the same integrated circuit (IC) 101. Electrical system 100 may comprise a system-on-chip (SoC). In one example, Device A may comprise a processor, a memory device or a peripheral device. Similarly, Device B may comprise a processor, a memory device or a peripheral device. Examples of peripheral devices include an analog-to-digital converter (ADC) and a multichannel Serial Peripheral Interconnect (SPI) interface. Data can be transmitted from device A to device B, or from device B to device A. Additional devices may be included as well, and connected to any of the interconnect segments 108, 110, and 112 and bridges 109 and 111.

Devices A and B are coupled together by the series of interconnect segments and bridges. In the example of FIG. 1, a communication pathway between devices A and B includes interconnect segments 108, 110, and 112 and bridges 109 and 111. Each interconnect segment 108, 110, 112 may be implemented as a switch (e.g., a cross-bar switch) having multiple inputs and multiple outputs. Device A is coupled to an input of interconnect segment 108, and an output of interconnect segment 108 is coupled to bridge 109. The bridge 109, in turn, is coupled to an input of interconnect segment 110, and an output of interconnect segment 110 is coupled to bridge 111. Bridge 111 is coupled to an input of interconnect segment 112 over a communication labeled 120, and an output of interconnect segment 112 is coupled to target device 114. Although three interconnect segments 108, 110, 112 and two bridges 109, 111 are shown in the example of FIG. 1, any number of interconnect segments and bridges may be included.

The communication links between the interconnect segments and bridges (e.g., communication link 120) may be bi-directional or uni-directional. Each communication link includes an error detect circuit that detects errors in data transferred across that link. The error detect circuits may employ parity bits, ECC bits, or another type of data error detection. Some data error checking schemes permit a bit error to be detected but not corrected. That is, the error detect circuit can detect that one of the bits of the data is in error, but not which bit is erroneous. Other error detect circuits can both detect and correct errors. Such error detect circuits can detect that a bit is in error, which bit is in error, and thus correct that bit. Regardless of the type of data error detection included within the series of interconnect segments and bridges, the interconnect segments and bridges include error detect circuits to help ensure data integrity during run-time operation of the electrical system 100.

Figure 2:
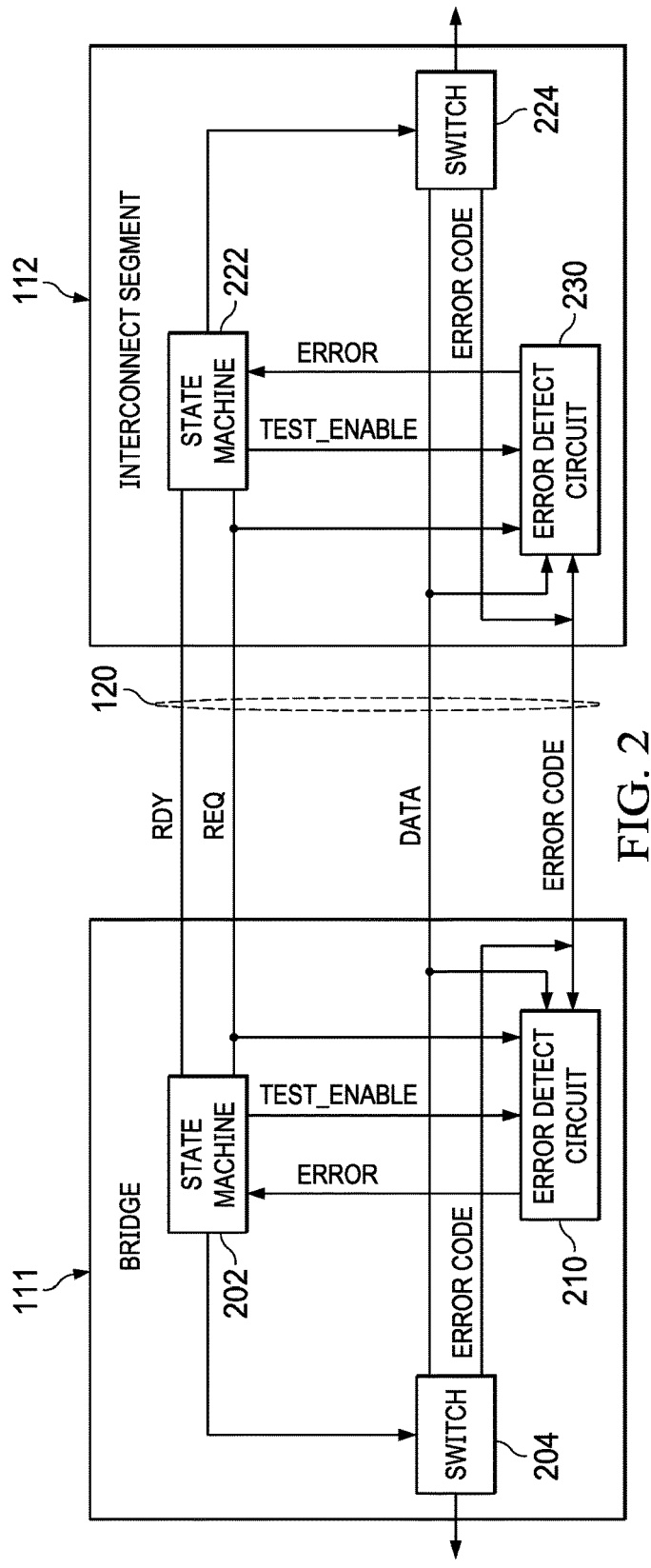
FIG. 2 shows an example implementation of a communication link between a bridge and an interconnect segment.

FIG. 2 shows an example implementation of a bridge and an adjacent interconnect segment. This example includes bridge 111 and interconnect segment 112 to which the bridge 111 is coupled. The communication link 120 between the bridge 111 and interconnect segment 112 is bi-directional in this example. The example bridge 111 includes a state machine 202, a switch 204, and an error detect circuit 210. Similarly, the interconnect segment 112 includes a state machine 222, a switch 224, and an error detect circuit 230. The communication link 120 includes the signals request (REQ), ready (RDY), DATA, and ERROR CODE. When one of the bridge 111 or interconnect segment 112 has data to transmit across the communication link 120, the state machine of the respective bridge/interconnect segment asserts REQ (e.g., logic high). In response to detection of an asserted REQ, the state machine of the other of the bridge 111 or interconnect segment 112 asserts RDY to indicate that it is ready to receive the data. The ERROR CODE is generated by the device A or B that originated the data to be transmitted to other of device A or B. ERROR CODE may comprise any number of parity bits, ECC values, or any other type of data that the receiving bridge 111 or interconnect segment 112 can use to determine the accuracy of the received DATA.

The error detect circuit 210 of the bridge 111 receives both DATA and the ERROR CODE from the interconnect segment 112 and determines whether DATA is valid (error free) using the ERROR CODE. If an error is detected in the received DATA from the interconnect segment 112, the error detect circuit 210 asserts an error signal (ERROR) to the state machine 202. In response to an asserted ERROR, the state machine 202 may cause switch 204 not to forward DATA on to other components within the system, request the interconnect segment 112 to resend the data, and/or take any other suitable action.

The error detect circuit 230 of the interconnect segment operates similarly to the error detect circuit 210 of the bridge 111. The error detect circuit 230 of the interconnect segment 112 receives both DATA and the ERROR CODE from the bridge 111 and determines whether DATA is valid (error free) using the ERROR CODE. If an error is detected in the received DATA from the bridge 111, the error detect circuit 230 asserts an error signal (ERROR) to the state machine 222. In response to an asserted ERROR, the state machine 222 may cause switch 224 not to forward DATA on to other components within the system, request the bridge 111 to resend the data, and/or take any other suitable action.

The error detect circuits 210 and 230 are also coupled to the REQ signal line and thus can determine when a transaction is to be initiated in any given bus cycle. The respective state machines 202 and 222 also generate a Test_Enable signal to the error detect circuit 210, 230 at a time when no transactions are expected. In one implementation, when REQ is a 1 and Test_Enable is a 0, data is to be transmitted across the link 120. When REQ is a 0 and Test_Enable is a 1, then the test functionality of the error detect circuits as described below is enabled. Responsive to a given error detect circuit 210, 230 receiving REQ=0 and Test_Enable=1, the error detect circuit 210, 230 initiates a test of its fault detection capability. The test may involve providing the fault detection component within the error detect circuit one or more test data patterns and corresponding test error codes. The respective state machine 202, 222 monitors the ERROR signals from the error detect circuits 210, 230 to confirm whether the error detect circuits are operating correctly.

Figure 3:
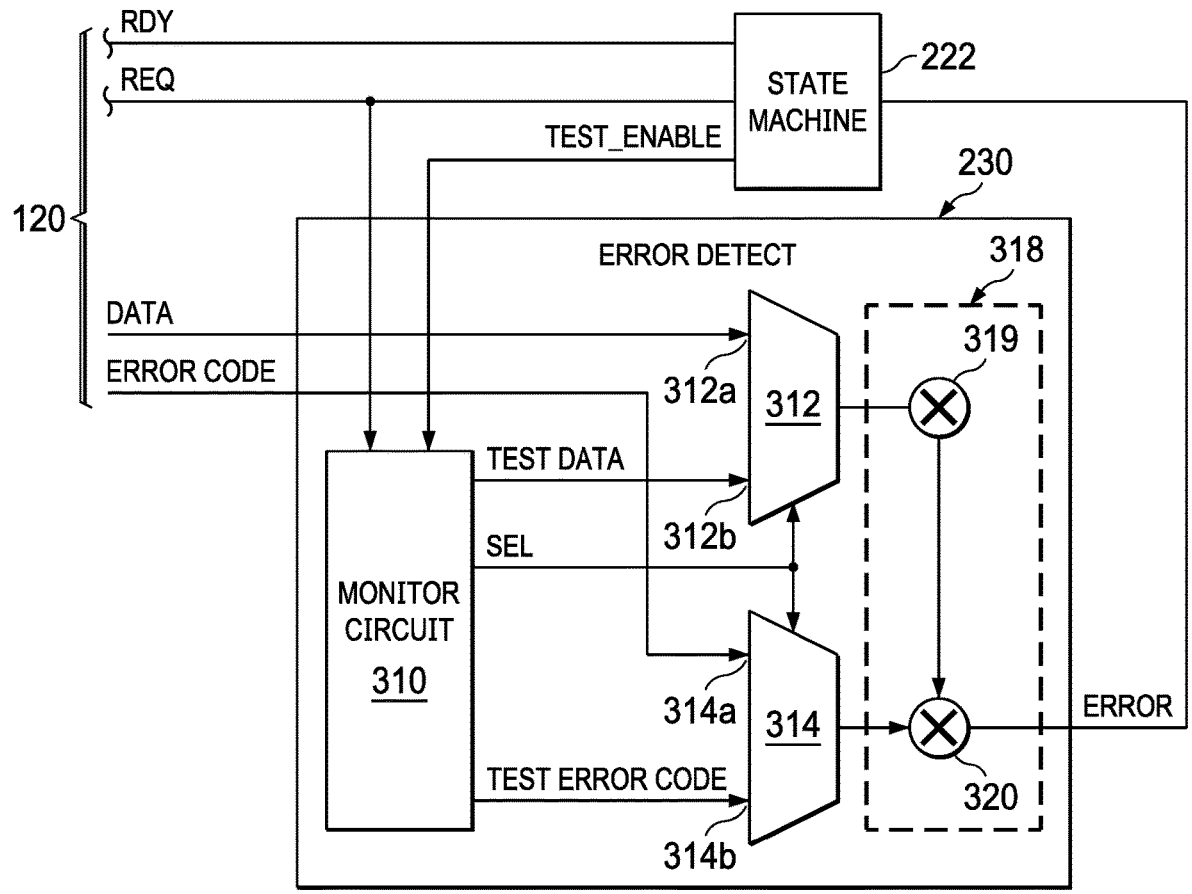
FIG. 3 shows an example implementation of an error detect circuit usable within one or more communication links of the electrical system.

FIG. 3 shows an example implementation of error detect circuit 210, although the example implementation is applicable to all of the error detect circuits within the electronic system 100 (e.g., error detect circuit 230). The error detect circuit 230 includes a monitor circuit 310, multiplexers 312 and 314, and exclusive-OR logic 318. The exclusive-OR logic 318 includes one or more exclusive-OR gates 319 and one or more exclusive-OR gates 320. The monitor circuit 310 receives REQ and Test_Enable and generates or otherwise provides a test data pattern (TEST DATA) and a corresponding test error code (TEST ERROR CODE) when no transaction is to be transferred across the link 120 to thereby identify an appropriate time to test the exclusive-OR logic 320. Multiplexer 312 has a first input 312a that receives DATA and a second input 312b that receives TEST DATA from the monitor circuit 310. Multiplexer 314 includes a first input 314a that receives ERROR CODE and a second input 314b that receives TEST ERROR CODE from the monitor circuit 310.

The monitor circuit 310 generates a select signal (SEL) to select inputs of multiplexers 312 and 314. SEL is asserted to cause the multiplexers 312 and 314 to provide either the signals on their first inputs 312a and 314a to their outputs or the signals on their second inputs 312b and 314b to their outputs. That is, the outputs from multiplexers 312 and 314 are either DATA and the corresponding ERROR CODE or TEST DATA and the corresponding TEST ERROR CODE.

The output from multiplexer 312 is coupled to inputs of exclusive-OR gate(s) 319, which determines the exclusive-OR function of the selected DATA or TEST DATA. The output of exclusive-OR gate(s) 319 is coupled to inputs of exclusive-OR gate(s) 320. The output of multiplexer 314 is also coupled to inputs of the exclusive-OR logic 320. The exclusive-OR of the DATA or TEST DATA is then exclusive-OR'd with the respective ERROR CODE or TEST ERROR CODE by exclusive-OR gate(s) logic 320 to thereby determine whether the input data is valid using the corresponding error code, that is, depending on the logic state of SEL and Test_Enable whether DATA is valid based on ERROR CODE or whether TEST DATA is valid based on TEST ERROR CODE.

The monitor circuit 310 asserts SEL to cause multiplexers 312 and 314 to select DATA and ERROR CODE responsive to REQ being asserted high and Test_Enable being low, which is indicative of communication link 120 being used to transmit data. The monitor circuit 310, however, controls SEL to cause multiplexers 312 and 314 to select TEST DATA and TEST ERROR CODE responsive to REQ being low and Test_Enable being high, which is indicative of communication link 120 not being used to transmit data in a given bus cycle.

Figure 4:
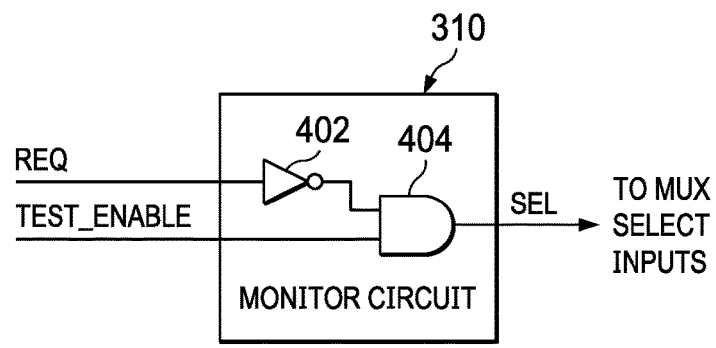
FIG. 4 shows an example implementation of a monitor circuit for the error detect circuit of FIG. 3.

FIG. 4 shows an example implementation of the monitor circuit 310. In this example, the monitor circuit 310 includes an inverter 402 and an AND gate 404. The input of inverter 402 is coupled to REQ and the output of inverter 402 is coupled to an input of AND gate 404. The other input of AND gate 404 is coupled to Test_Enable. The output of AND gate 404 generates the SEL signal to the select inputs of multiplexers 312 and 314. Inverter 402 and AND gate 404 implement the logic described above. That is, SEL is asserted to a state to cause the multiplexers 312 and 314 to select DATA and ERROR CODE responsive to REQ=1 and Test_Enable=0, and to cause the multiplexers to select TEST DATA and TEST ERROR CODE responsive to REQ=0 and Test_Enable=1. The TEST DATA and TEST ERROR CODE are pre-determined and stored in registers or other types of storage mechanism within the electrical system 100. Multiple pairs of TEST DATA and TEST ERROR CODE may be available to test the error detect circuits.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A device comprising:
   a first circuit device;
   a second circuit device; and
   a bridge communicatively coupled between the first circuit device and the second circuit device, wherein the bridge includes:
      a data input coupled to receive a first set of data;
      an error code input coupled to receive a first error code signal;
      an error detection circuit coupled to the data input and the error code input, wherein the error detection circuit includes:
         a first multiplexer coupled to receive the first set of data and a test set of data and to select between providing the first set of data or the test set of data as an intermediate set of data based on whether the data input is in use;
         a second multiplexer coupled to receive the first error code signal and a test error code signal and to select between providing the first error code signal or the test error code signal as an intermediate error code signal based on whether the data input is in use; and
         logic coupled to the first multiplexer and the second multiplexer and configured to determine whether to assert an error signal based on the intermediate set of data and the intermediate error code signal.

2. The device of claim 1, wherein the error detection circuit includes a sub-circuit that includes:
   a first output coupled to the first multiplexer to provide the test set of data;
   a second output coupled to the second multiplexer to provide the test error code signal; and
   a select output coupled to the first multiplexer and the second multiplexer.

3. The device of claim 2, wherein:
   the logic is first logic;
   the bridge includes second logic configured to provide a test enable signal to the sub-circuit of the error detection circuit based on whether the data input is in use; and
   the sub-circuit of the error detection circuit is configured to cause the first multiplexer and the second multiplexer to switch based on the test enable signal.

4. The device of claim 3, wherein:
   the bridge includes a request input coupled to receive a request signal;
   the sub-circuit of the error detection circuit is coupled to the request input to receive the request signal; and
   the sub-circuit of the error detection circuit is configured to cause the first multiplexer and the second multiplexer to switch further based on the request input.

5. The device of claim 1, wherein the first error code signal includes at least one of a parity bit or an error correction code.

6. The device of claim 1, wherein:
   the bridge includes a switch coupled to receive the first set of data and the first error code signal; and
   the switch is configured to prevent providing the first set of data and the first error code signal based on the error signal.

7. The device of claim 1 further comprising an interconnect segment coupled between the bridge and the second circuit device and configured to provide the first set of data and the first error code signal to the bridge.

8. The device of claim 1, wherein each of the first circuit device and the second circuit device include at least one of: a processor, a memory device, or a peripheral device.

9. The device of claim 1, wherein the logic includes exclusive-OR logic.

10. The device of claim 1, wherein the data input and the error code input are bi-directional.

11. A circuit device comprising:
   a data input;
   an error code input;
   an error detection circuit coupled to the data input and the error code input, wherein the error detection circuit includes:
      a sub-circuit that includes a test data output and a test error code output; and
      a first multiplexer that includes a first input coupled to the data input, a second input coupled to the test data output of the sub-circuit, and an output to provide an intermediate set of data;
      a second multiplexer that includes a first input coupled to the error code input, a second input coupled to the test error code output of the sub-circuit, and an output to provide an intermediate error code; and
      logic coupled to the first multiplexer and the second multiplexer and configured to determine whether to assert an error signal based on the intermediate set of data and the intermediate error code.

12. The circuit device of claim 11, wherein the first multiplexer and the second multiplexer are configured to switch based on whether the data input is in use.

13. The circuit device of claim 11, wherein:
each of the first multiplexer and the second multiplexer includes a select input; and
the sub-circuit includes a select output coupled to the select input of the first multiplexer and the select input of the second multiplexer.

14. The circuit device of claim 13, wherein:
the logic is first logic;
the circuit device further comprises second logic configured to provide a test enable signal to the sub-circuit based on whether the data input is in use; and
the sub-circuit of the error detection circuit is configured to cause the first multiplexer and the second multiplexer to switch based on the test enable signal.

15. The circuit device of claim 14 further comprising a request input coupled to the sub-circuit, wherein the sub-circuit is configured to cause the first multiplexer and the second multiplexer to switch further based on the request input.

16. The circuit device of claim 11, wherein the intermediate error code includes at least one of a parity bit or an error correction code.

17. The circuit device of claim 11 further comprising a switch coupled to the data input and the error code input, wherein the switch is configured to selectively couple the data input and the error code input based on the error signal.

18. The circuit device of claim 11, wherein the logic includes exclusive-OR logic.

19. The circuit device of claim 11 further comprising a system-on-a-chip that includes:
a first circuit device;
a second circuit device; and
a bridge coupled between the first circuit device and the second circuit device that includes the data input, the error code input, and the error detection circuit.

20. The circuit device of claim 19, wherein each of the first circuit device and the second circuit device include at least one of: a processor, a memory device, or a peripheral device.

\* \* \* \* \*